United States Patent [19]

Sato et al.

[11] Patent Number: 5,369,089
[45] Date of Patent: Nov. 29, 1994

[54] METHOD OF PREPARING OXIDE SUPERCONDUCTING WIRE

[75] Inventors: Kenichi Sato; Hidehito Mukai; Takeshi Hikata, all of Osaka, Japan

[73] Assignee: Sumitomo Electric Industries, Ltd., Osaka, Japan

[21] Appl. No.: 128,010

[22] Filed: Sep. 27, 1993

Related U.S. Application Data

[63] Continuation of Ser. No. 730,409, Jul. 16, 1991, abandoned.

[30] Foreign Application Priority Data

Jul. 16, 1990 [JP] Japan ................... 2-188495

[51] Int. Cl.$^5$ ................... H01L 39/24; H01B 13/00
[52] U.S. Cl. ................... 505/433; 505/431; 505/430; 505/704; 505/742; 427/62; 29/599; 174/125.1
[58] Field of Search ................... 505/1, 704, 742, 433, 505/431, 430; 427/62; 29/599; 174/125.1

[56] References Cited

FOREIGN PATENT DOCUMENTS

| 281474A2 | 9/1988 | European Pat. Off. . |
| 0357779A1 | 3/1990 | European Pat. Off. . |
| 63-279512 | 11/1988 | Japan . |
| 63-282152 | 11/1988 | Japan . |
| 1-138167 | 5/1989 | Japan . |
| 02247906 | 10/1990 | Japan . |

OTHER PUBLICATIONS

M. Okada et al. "Fabrication of Ag-Sheathed Ba-Y-Cu Oxide Superconductor Tape" Japanese Journal of Applied Physics Letters vol. 27, No. 2, Feb. 1988, pp. L185-L187.

H. Sekine et al. "Metalliargical Studies and Optimization of Critical Current Density in Bi-(Pb)-Sr-Ca-Cu-O Superconductors" Japanese Journal of Applied Physics, vol. 28, No. 7, Jul. 1989, pp. 1185-1188.

M. Mimura et al. "Improvement of the Critical Current Density of the Silver Sheathed Bi-Pb-Sr-Ca-Cu-O Superconducting Tape" Applied Physics Letter, vol. 54, No. 16, 17 Apr. 1989, pp. 1582-1584.

M. K. Wu et al. "Superconductivity at 93K in a New Mixed-Phase Y-Ba-Cu-O Compound System at Ambient Pressure" Physical Review Letters, Col. 58, No. 9, 2 Mar. 1987 pp. 908-910.

Mizuno et al, "Superconductivity of $Bi_2Si_2Ca_2Cu_3Pb_xO_y$ (X=0.2, 0.4, 0.6), " Jpn. J. Appl. Phys. 27(7) Jul. 1988 pp. L1225-L1227.

Kumakura et al, "Bi(Pb)-Sr-Ca-Cu-O Superconducting Composite Tapes Prepared by the Powder Method Using an Ag Sheath," J. Appl. Phys. 67(7) Apr. 1990 pp. 3443-3447.

Primary Examiner—Roy V. King
Attorney, Agent, or Firm—Pennie & Edmonds

[57] ABSTRACT

Disclosed herein is a method of preparing an oxide superconducting wire comprising the steps of coating a powder material for forming an oxide superconductor with a metal, performing deformation processing on the metal-coated powder material thereby obtaining a tape-type wire material, superposing a plurality of such tape-type wire materials, performing first heat treatment on the plurality of superposed tape-type wire materials while simultaneously diffusion-bonding the metallic coats to each other, then performing deformation processing on the plurality of superposed tape-type wire materials, and performing second heat treatment on the plurality of deformation-processed tape-type wire materials. Preferably the oxide superconductor to be obtained is a bismuth oxide superconductor having a 2223 composition in a composition of Bi—Sr—Ca—Cu or (Bi,Pb)—Sr—Ca—Cu, and the powder material consists of a superconducting phase, which is mainly composed of a 2212 phase, and non-superconducting phases.

3 Claims, No Drawings

METHOD OF PREPARING OXIDE SUPERCONDUCTING WIRE

This is a continuation of application Ser. No. 07/730,409, filed Jul. 16, 1991, now abandoned.

BACKGROUND OF THE INVENTION

1. Field of the Invention

The present invention relates to a method of preparing an oxide superconducting wire, and more particularly, it relates to an improvement for increasing the critical current density of the as-formed oxide superconducting wire.

2. Description of the Background Art

In relation to an oxide superconducting wire, it has been recognized possible to attain a high critical current density by covering a powder material for forming an oxide superconductor with a metal, strongly working the metal-covered powder material into a thin tape by deformation processing, and combining such working with heat treatment.

A superconducting wire which is applied to practical use must have a high critical current density, a high critical current and excellent mechanical properties.

If only a high critical current and excellent mechanical properties are required for such an oxide superconducting wire, a thick tape may be employed as the material. In this case, however, the critical current density of the as-formed oxide superconducting wire disadvantageously remains at a low level.

SUMMARY OF THE INVENTION

Accordingly, an object of the present invention is to provide a method of preparing an oxide superconducting wire, which has a high critical current density and a high critical current, as well as excellent mechanical properties.

According to the present invention, a powder material for forming an oxide superconductor is first covered with a metal, and then deformation processing is performed on the metal-covered powder material, thereby obtaining a tape-type wire material. A plurality of such tape-type wire materials are superposed with each other, and subjected to first heat treatment in this stage. Then the plurality of superposed tape-type wire materials are subjected to deformation processing, and thereafter second heat treatment is performed.

Preferably the metal coverings are diffusion-bonded to each other in the first heat treatment step.

Further, the powder material is preferably degassed before the same is covered with the metal.

The present invention can be advantageously applied to a method of preparing a superconducting wire which contains a bismuth oxide superconductor. In this case, the oxide superconductor to be obtained is a bismuth oxide superconductor which has a 2223 composition in a composition of Bi—Sr—Ca—Cu or (Bi,Pb)—Sr—Ca—Cu, and the powder material consists of a superconducting phase, which is mainly composed of a 2212 phase, and non-superconducting phases.

According to the present invention, the plurality of tape-type wire materials are so superposed with each other that strong working can be performed on the individual tape-type wire materials while ensuring a high critical current and excellent mechanical properties, whereby it is possible to attain a high critical current density.

In the first heat treatment step, the metal coverings are diffusion-bonded to each other so that deformation processing can thereafter be homogeneously carried out.

When the powder material is degassed before the same is covered with the metal, homogeneous properties can be attained over the longitudinal direction of the as-formed oxide superconducting wire. Thus, it is possible to obtain a long oxide superconducting wire having excellent properties.

The present invention is particularly effectively applied to a method of preparing an oxide superconducting wire which contains a bismuth oxide superconductor. In this case, the bismuth oxide superconductor has a 2223 composition in a composition of Bi—Sr—Ca—Cu or (Bi,Pb)—Sr—Ca—Cu, and particularly high properties are attained when the powder material consists of a superconducting phase, which is mainly composed of a 2212 phase, and non-superconducting phases.

DESCRIPTION OF THE PREFERRED EMBODIMENTS

Oxides and carbonates were so mixed that Bi, Pb, Sr, Ca and Cu were in the ratios 1.84:0.42:2.02:2.23:3.01, and this mixture was heat treated to prepare a powder material consisting of a 2212 phase and non-superconducting phases. This powder material was degassed under a decompressed atmosphere of 2 Torr at 700° C. for 3 hours.

This powder material was covered with a silver pipe, which in turn was drawn into a diameter of 1 mm, and then rolled into a thickness of 0.2 mm.

Eight tape-type wire materials obtained in the aforementioned manner were stacked with each other to form a laminate. This laminate was heat treated at 840° C. for 50 hours, and rolled at a degree of 40%.

This laminate was thick and integrated by the heat treatment, and exhibited excellent mechanical properties. The laminate was again heat treated at 840° C. for 50 hours.

The as-formed oxide superconducting wire was cut into a length of 20 m, and subjected to evaluation of properties. As the result, this wire exhibited excellent properties in liquid nitrogen, with a critical current density of 22000 A/cm$^2$ and a critical current of 240 A. The superconducting wire was easy to handle also after heat treatment.

What is claimed is:

1. A method of preparing an oxide superconducting wire, consisting essentially of the following sequence of steps:

covering a powder material for forming an oxide superconductor with a metal covering;

performing deformation processing on said metal-covered powder material to obtain a tape-shaped wire material having a length of at least about 20 meters;

superposing a plurality of said tape-shaped wire materials;

performing a first heat treatment on said plurality of superposed tape-shaped wire materials, wherein said metal coverings are diffusion-bonded to each other in said first heat treatment step;

performing deformation processing consisting essentially of a rolling on said plurality of superposed tape-shaped wire materials; and performing a second heat treatment on said plurality of deformation-processed tape-shaped wire materials.

2. A method of preparing an oxide superconducting wire in accordance with claim 1, wherein said powder material is degassed before said covering step.

3. A method of preparing an oxide superconducting wire in accordance with claim 1, wherein said oxide superconductor to be obtained is a bismuth oxide superconductor having a 2223 composition in a composition of Bi—Sr—Ca—Cu or (Bi,Pb)—Sr—Ca—Cu, and said powder material consists of a superconducting phase, being mainly composed of a 2212 phase, and non-superconducting phases.

* * * * *